United States Patent [19]

Hurrell

[11] Patent Number: 5,838,598
[45] Date of Patent: Nov. 17, 1998

[54] METHOD AND APPARATUS FOR GAIN CORRECTION OF A SIGMA-DELTA CONVERTER

[75] Inventor: Christopher Peter Hurrell, Maidenhead, England

[73] Assignee: Analog Devices, Inc., Norwood, Mass.

[21] Appl. No.: 571,148

[22] Filed: Dec. 12, 1995

[51] Int. Cl.⁶ .............................. G06F 17/10; H03M 1/00; H03M 1/10

[52] U.S. Cl. ................................. 364/724.011; 364/724.1; 364/724.12; 364/724.13; 341/120; 341/126; 341/143

[58] Field of Search .......................... 364/724.011, 724.1, 364/724.12, 724.13, 724.16; 341/110, 118, 120, 126, 143, 144, 155

[56] References Cited

U.S. PATENT DOCUMENTS

| | | | |
|---|---|---|---|
| 3,872,290 | 3/1975 | Crooke et al. ........................ | 364/724.1 |
| 5,157,395 | 10/1992 | Del Signore et al. ................ | 364/724.1 |
| 5,506,798 | 4/1996 | Shimada et al. .................... | 364/724.12 |
| 5,598,157 | 1/1997 | Kornblum et al. ..................... | 341/120 |

*Primary Examiner*—Emmanuel L. Moise
*Attorney, Agent, or Firm*—Iandiorio & Teska

[57] ABSTRACT

Gain correction for a digital filter is accomplished by multiplying each data value by a coefficient representing the impulse response of the filter to form a convolution of the data values; accumulating the sum of the product of each multiplication to obtain a complete convolution; determining the difference between the positive full scale output and the negative full scale output of the filter; combining this difference with the ideal full scale output value to obtain the gain error factor; dividing the gain error factor by the full scale ideal value to obtain the gain correction factor; multiplying the negated accumulated sum of the product of each multiplication by the gain correction factor to obtain the gain error adjustment factor and combining the gain error adjustment factor with the accumulated sum to compensate for gain errors in the filter output.

9 Claims, 2 Drawing Sheets

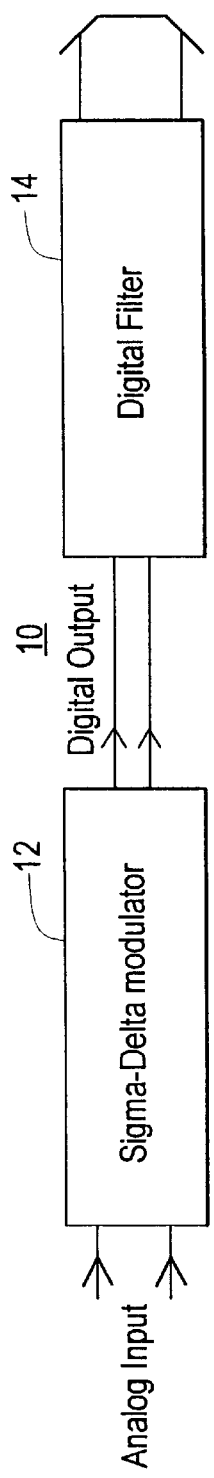
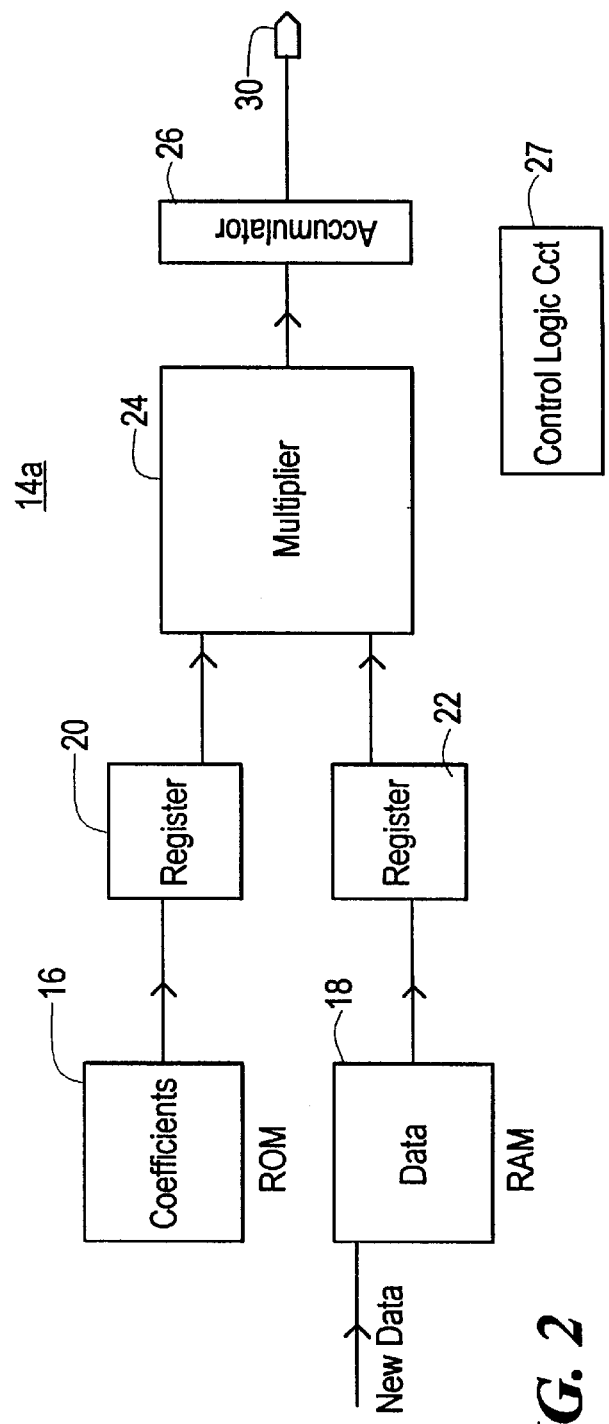
FIG. 1
FIG. 2 PRIOR ART

METHOD AND APPARATUS FOR GAIN CORRECTION OF A SIGMA-DELTA CONVERTER

FIELD OF INVENTION

This invention relates to a method and apparatus for gain correction in a digital filter.

BACKGROUND OF INVENTION

Sigma-delta converters typically consist of a sigma-delta modulator, normally an analog to digital converter (ADC) and a filter, typically a finite impulse response (FIR) filter. An FIR filter has a random access memory (RAM) which stores previous data values received from the ADC and a read only memory (ROM) that stores filed coefficients that represent the impulse response of the filter. There is also a digital multiplier, two registers that receive and hold, for submission to the multiplier, the multiplicand values from the RAM and ROM, an accumulator that adds together the outputs of the multiplier and a control logic circuit which controls the operations. This architecture allows a "convolution" to be performed of the data values in RAM with the coefficients in ROM. In a single convolution, the accumulator is first cleared (set to zero) and then each data value in RAM is multiplied by a corresponding ROM coefficient and the result added to the previous result in the accumulator. Once each value in RAM has been multiplied by the corresponding coefficient, the convolution has been completed. The final value in the accumulator is the output from the convolution.

Although the gain error of the digital filter is very small and predictable there is usually a significant gain error in the modulator, resulting from the mis-match in analog components. This mis-match can easily result in a gain error of 1% or more. This gain error can be corrected by multiplying the output from the digital filter by a correction factor. A number of techniques exist for deriving the gain correction factor. The usual technique is to derive this factor from the Positive Full Scale (PFS) and Negative Full Scale (NFS) outputs from the filter.

The negative full scale value is generated by applying negative full scale to the inputs of the modulator, waiting sufficient time for the modulator and digital filter to settle, and calculating the average NFS value from a number of digital filter outputs. The positive full scale value is generated by applying positive full scale to the modulator inputs, waiting sufficient time for the modulators and digital filter to settle, and calculating the average PFS value from a number of digital filter outputs.

The ideal gain correction factor is then typically generated using a divider circuit. If the ideal difference between PFS and NFS is $FS_{ideal}$ then the ideal gain correction factor is given by:

*Correction factor=FSideal/(PFS−NFS)*

The uncorrected output from the ADC is then multiplied by this correction factor, which value is close to 1, to give a gain corrected final value.

SUMMARY OF INVENTION

It is therefore an object of this invention to provide an improved method and apparatus for gain correction in a digital filter.

It is a further object of this invention to provide such an improved method and apparatus which applies the gain correction by adding a gain correction factor to the uncorrected result rather than multiplying the uncorrected result by a correction factor.

It is a further object of this invention to provide such an improved method and apparatus which is simpler, less expensive, and employs fewer components to implement.

This invention features a gain control digital filter including a multiplier, first storage means for storing coefficients representing impulse responses of the filter, and second storage means for storing data to be filtered. There are first and second multiplicand registers, responsive to the first and second storage means, respectively, for providing coefficients and data values to the multiplier to perform a convolution of the data values with the coefficients. An accumulator, responsive to the multiplier, accumulates the multiplier products during the convolution and an inverter, responsive to the accumulator, supplies to one of the first and second multiplicand registers the inverse of the accumulated sum. A gain correction circuit responsive to the accumulator generates a gain correction factor, and a switching means delivers to the first and second registers in the convolution mode the coefficient and a series of data values to perform a convolution and in the compensation mode the inverted accumulated sum and the gain error correction factor to obtain at the output of the accumulator the convolution of the data values compensated for gain error.

In a preferred embodiment the switching means may include a switching circuit associated with each multiplicand register and with the gain correction circuit. The gain correction circuit may include means for determining the difference between positive full scale and negative full scale values of the filter; means for combining the difference and a full scale ideal value to obtain a gain error factor; means for dividing the gain error factor by the full scale ideal value to obtain the gain correction factor; and gain register means for storing the gain correction factor multiplied by some binary power of 2. The means for determining may include means for loading the accumulator with the negated negative full scale value by introducing a negative 1 into one multiplicand register and the negative full scale value into the other for submission to the multiplier and subsequent addition to the reset accumulator, followed by a convolution that adds the positive full scale value to the negated negative full scale value in the accumulator. The means for combining the difference and the full scale ideal value may include means for suppressing the most significant bit of the difference. The means for suppressing the most significant bit of the difference may include means for terminating the most significant bit output. The means for dividing the gain error factor by the full scale ideal value may include means for shifting the full scale ideal value. The means for shifting may include means for suppressing a number of bits equal to the number of bits in the full scale ideal value. the means for suppressing the number of bits may include means for terminating, the outputs of bits in the full scale ideal value.

The invention also features a method of gain correction for a digital filter including multiplying each data value by a coefficient representing the impulse response of the filter to perform a convolution of the data values; accumulating the sum of the product of each multiplication to obtain a complete convolution and determining the difference between the positive full-scale output and the negative full-scale output of the filter. That difference and the full-scale ideal value are combined to obtain a gain error factor. The gain error factor is divided by the full-scale ideal value to obtain a gain correction factor. The negated accumulated sum of the product of each multiplication is multiplied by the gain correction factor to obtain a gain error adjustment factor and the gain error adjustment factor is combined with the accumulated sum to compensate for gain errors in the ultimate filter output.

BRIEF DESCRIPTION OF DRAWINGS

Other objects, features and advantages will occur to those skilled in the art from the following description of a preferred embodiment and the accompanying drawings, in which:

FIG. 1 is a generalized block diagram of sigma-delta converter including a sigma-delta modulator and digital filter;

FIG. 2 is a block diagram of a typical prior art digital filter that can be used in the converter of FIG. 1.

DESCRIPTION OF THE PREFERRED EMBODIMENT

Figure 3:
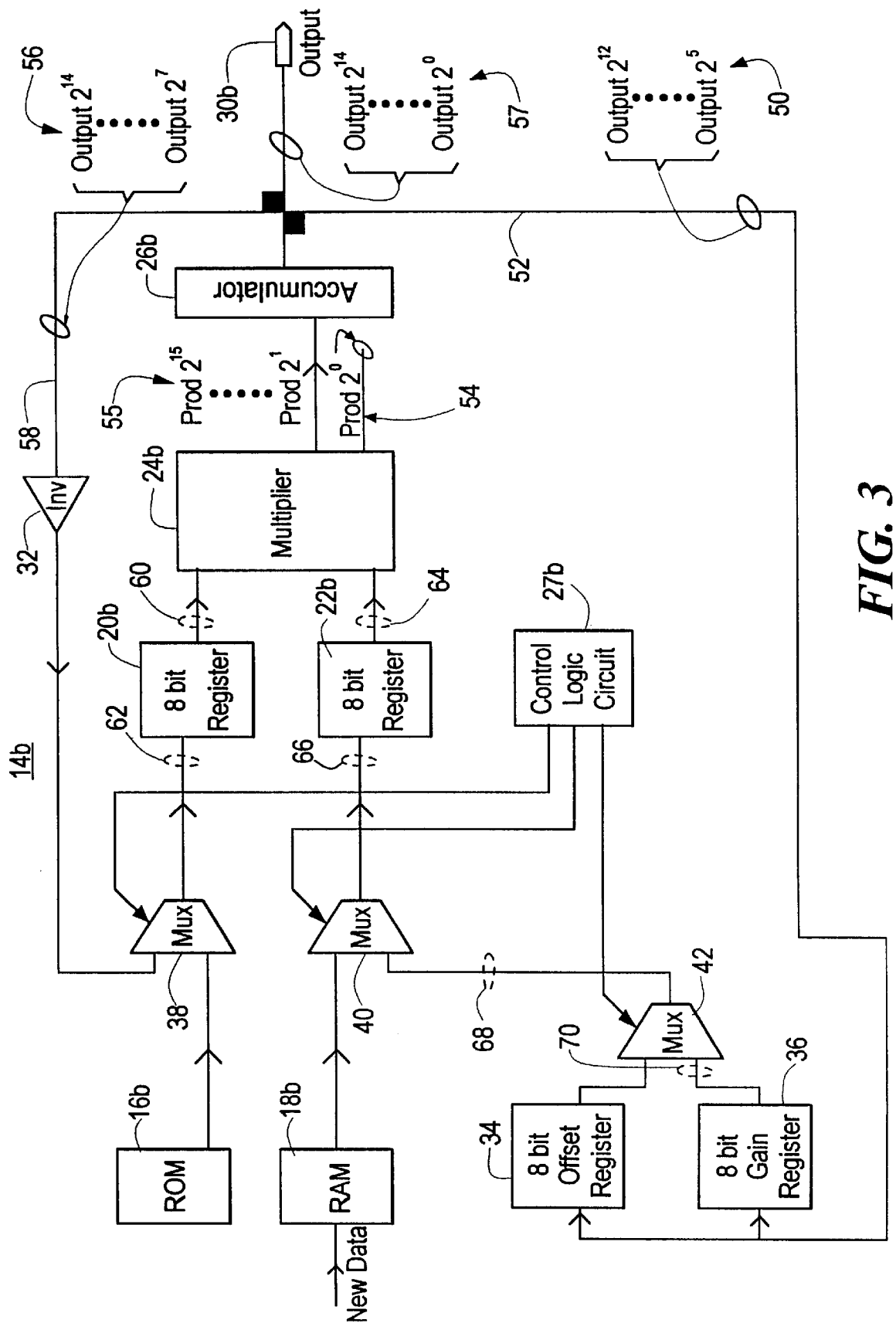
FIG. 3 is a detailed diagram of a digital filter with offset and gain correction according to this invention.

There is shown in FIG. 1 a sigma-delta converter 10 including a sigma-delta modulator 12 and digital filter 14. Sigma-delta modulator 12 is typically an analog to digital converter which receives an analog input and provides a digital output. The output is typically a high frequency low resolution output with a high out of band noise content. Digital filter 14 is typically a finite impulse response (FIR) filter which receives a digital output and removes the out of band noise as well as reduces the clock data rate by decimation to provide a low frequency high resolution output.

A typical FIR digital filter 14a, FIG. 2, includes read only memory 16 which contains a plurality of coefficients representing the impulse responses of the filter and random access memory 18 which contains the data to be filtered. In operation, a coefficient is selected from ROM 16 and stored in multiplicand register 20 while a corresponding data value from RAM 18 is submitted to multiplicand register 22. After all of the data values in RAM 18 have been multiplied by all the corresponding coefficients from ROM 16 in multiplier 24 and stored in accumulator 26, a complete convolution has occurred. A new convolution result is obtained by shifting one or more new data values into RAM 18 and shifting the same number of old data values out of RAM 18, and repeating the convolution as before. If for each convolution data is shifted in by more than one data value at a time then decimation occurs. For example, if four new data values are shifted in and out for each convolution, then the clock rate is decimated or divided by four. In practice the shifting operation is often performed by a RAM address counter.

There are two kinds of errors that occur in the ADC: offset error and gain error.

Offset error is determined during a calibration cycle by applying negative full scale to the inputs of modulator 12, FIG. 1, and noting the output from filter 14a. If the output is zero then there is no offset error. However, more often the output is not zero. This differential is the offset error and is stored in an offset register. The operation of filter 14a is controlled by control logic circuit 27. Gain error is determined during a calibration cycle by applying negative full scale to the input of the modulator and determining the negative full scale value at the output of the filter, and by providing a positive full scale value at the input to the modulator and determining the positive full scale value at the output of the filter. The difference between these two values should be equal to the full scale ideal. In previous implementations, the correction factor is typically generated in accordance with the equation:

$$\text{Correction Factor} = \frac{FS_{ideal}}{(PFS - NFS)} \quad (1)$$

where $FS_{ideal}$ is the desired difference between positive full scale and negative full scale values, PFS is the positive full scale value, and NFS is the negative full scale value. This factor is calculated and is stored in a gain register. During normal operation, to correct for offset or gain errors, the value in the offset register is first subtracted from the convolution result and then this value is multiplied by the correction factor in the gain register. The denominator of equation (1) is not a fixed power of 2 and thus this division requires a special divider circuit.

The offset correction is subject to simple implementation. However, because of the requirements for a special divider, the gain correction is more difficult, and it is to an improved gain correction technique that this invention is directed.

In accordance with this invention it has been realized that a gain correction factor can be achieved by using the first few terms of a geometric series to give a good approximation of the ideal gain corrected value:

$$= \text{Accumulated sum} - \overbrace{\text{Accumulated sum} * \underbrace{\frac{((PFS-NFS)-FS_{ideal})}{FS_{ideal}}}_{\text{gain error}}}^{\text{gain adjustment}} \quad (2)$$

$$\underbrace{\phantom{XXXXXXXXXXXXXXXXXXXXXXXXXX}}_{\text{gain correction}}$$

where PFS, NFS and $FS_{ideal}$ are as previously defined, the accumulated sum is the output of accumulator 26 and $FS_{2ideal}$ is chosen to be a binary power of 2.

The approximation expression given in equation (2) is fully implemented in accordance with the gain corrected filter 14b, FIG. 3, according to this invention. Filter 14b eliminates the need for a special divider circuit to calculate the gain correction factor and adds no multiplication or division circuits. Rather, it employs an additional inverter 32. That equation (2) defines a substantial correction in gain error can be seen by a simple numerical example, where the accumulated sum is equal to 1.1, the positive full scale PFS is also equal to 1.1, negative full scale NFS is equal to 0, and the $FS_{ideal}$ is equal to 1.

$$\text{Corrected Value} = 1.1 - 1.1 + \frac{((1.1 - 0.0) - 1.0)}{1.0} \quad (3)$$

Further simplifying this results in $$\text{Corrected value} = 1.1 - 1.1 \left(\frac{.1}{1}\right) \quad (4)$$

Executing the operations indicated in equation (4) results in the corrected value being 0.99. This corrected value for the output differs from the $FS_{ideal}$ by only 0.01, whereas previously the difference was 0.1. In this example the gain error has been corrected by a factor of 10.

In the convolution mode, control logic 27b, FIG. 3, operates multiplexers 38 and 40 so that the outputs from ROM 16b and RAM 18b are fed to registers 20b and 22b as previously explained with respect to filter 14a, FIG. 2. The multiplication is executed in multiplier 24b and the series of multiplications in the convolution are accumulated in accumulator 26b.

In the compensation mode, which generates the values to be permanently stored in the offset and gain registers, the sigma delta modulator 12, FIG. 1, first has negative full scale applied to its inputs. Once sufficient time has been allowed for the filter to settle to the new input condition the accumulator is cleared and a full convolution is performed. The resulting NFS value in the accumulator is stored in the offset register. Next full scale is applied to the modulator inputs to generate the PFS output from the digital filter 14*b*. Having waited sufficient time for the filter to settle to the new input condition, control logic circuit 27*b* retrieves a −1 value special "coefficient" from ROM 16*b* and places it in register 20*b* and Register 22*b* is loaded with the NFS value stored in register 34. The accumulator is then cleared and the product of the values −1 and NFS(−NFS) in registers 20*b* and 22*b* is loaded into the accumulator. A normal convolution is then performed of the values in ROM and RAM, adding a value PFS to the accumulator. The final value in the accumulator is then PFS−NFS. The value $FS_{ideal}$ is then subtracted from the accumulator value and the resulting value loaded into gain register 36. Thus as indicated by legend 50, the most significant bit, $2^{13}$, is dropped and the output begins at the next most significant bit $2^{12}$ which is delivered on line 52 from the output of accumulator 26*b* to the input of gain register 36.

This subtraction is performed very simply by dropping the bit corresponding to the value $FS_{ideal}$. For example, assuming that $FS_{ideal}$ is the binary number, $2^{13}$, then if the thirteenth bit is dropped the twelve remaining bits represent the difference between the actual full scale, PFS−NFS, and $FS_{ideal}$. Thus as indicated by legend 50, the most significant bit, $2^{13}$, is dropped and the output begins at the next most significant bit $2^{12}$ which is delivered on line 52 from the output of accumulator 26*b* to the input of gain register 36.

This term (PFS−NFS)−$FS_{ideal}$ represents the gain error factor as shown in equation (2). This must be divided by $FS_{ideal}$ to obtain the gain correction factor in equation (2). Since $FS_{ideal}$ is chosen to be a power of two, the division by $FS_{ideal}$ can be implemented by simply removing lower order bits. For example the decimal value 64 which has a binary equivalent of 1000000 can be divided by four by removing the bottom two bits to give a decimal value of 16 and a digital value of 10000. In the architecture described in FIG. 14B, $FS_{ideal}$ is $2^{13}$. The gain register could be loaded with value ((PFS−NFS)−$FS_{ideal}$)/$FS_{ideal}$ by simply dropping 13 lower order bit lines between the accumulator output and the gain register input. As shown in FIG. 14B, by legend 50, only a division by $2^5$ is implemented between the accumulator output and the gain register input. The remaining division by $2^8$ to achieve a total division by $2^{13}$ ($FS_{ideal}$) is done elsewhere as is explained in the next section.

Having obtained values for the offset and gain registers, as explained above, offset and gain correction during normal operation of the filter is performed in the following manner. Before a new convolution is started, the accumulator is first cleared and the value −NFS is loaded into the accumulator by multiplying the special coefficient-stored in ROM by the value NFS in the offset register. A convolution is then performed as explained previously to give an offset corrected result. To correct for gain, the value in the accumulator minus the 6 lower order bits is negated by inverters 32 and is fed to register 20*b*. Removal of the 6 lower bits, as shown by legend 56, has implemented a division by $2^6$. The value in the gain register is fed to register 22*b*. The product of register 20*b* and 22*b*, minus the LSB bit, as shown by legend 55, is added to the offset corrected value still in the accumulator. Removal of the 6 lower order bits before inverter 32 and the one bit between the multiplier output and the 1 bit between the multiplier output and accumulator input has implemented a division by $2^7$. Along with the division by $2^5$ described in the previous section, division by $2^{13}$ or $FS_{ideal}$ has been achieved as required by equation (2). The value added to the Accumulated sum in the accumulator is the gain adjustment factor in equation (2).

It should be understood that while the $2^{13}$ division has been split among lines 52, 54 and 58, this is not a necessary limitation of the invention. For example, one or more lines could be dropped at positions 60, 62, 64, 66, 68, 70 and/or 71 with the same effect. Note that the new technique according to this invention for correcting the gain of a sigma-delta converter can also be used within a digital filter following any analog to digital converter. Values referred to as negative and positive full scale may be any values at the output of the digital filter corresponding to two distinctly different input levels at the input of the ADC. To perform easy division by $FS_{ideal}$, as required in equation (2), $FS_{ideal}$ must be some binary power of two.

Where significant noise levels are present in the converter, the NFS and (PFS−NFS) values may be determined by adding together in the accumulator a number $2^M$ outputs corresponding to positive or negative full scale. In such an embodiment the implementation of the new gain correction technique is the same as described, except that in all references to $FS_{ideal}$, $FS_{ideal}$ is replaced by $2^M * FS_{ideal}$.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A gain corrected digital filter comprising:

a multiplier;

first storage means for storing coefficients representing impulse responses of the filter;

second storage means for storing data values to be filtered;

first and second multiplicand registers, responsive to said first and second storage means, respectively, for providing a coefficient and a series of said data values to said multiplier to perform a convolution of said data values;

an accumulator, responsive to said multiplier, to accumulate the sum of a convolution of said data values;

an inverter, responsive to said accumulator, for supplying to one of said first and second multiplicand registers the inverse of the accumulated sum;

a gain correction circuit responsive to said accumulator, for generating a gain correction factor; and switching means for delivering to said first and second registers in a convolution mode said coefficient and said series of data values to perform a convolution and in a compensation mode said inverted accumulated sum and said gain error correction factor to obtain at the output of said accumulator the convolution of the data values compensated for gain errors.

2. The gain corrected digital filter of claim 1 in which said switching means includes a switching circuit associated with each said multiplicand register and with said gain correction circuit.

3. The gain corrected digital filter of claim 1 in which said gain correction circuit includes means for determining the difference between positive full scale and negative full scale values of the filter; means for combining said difference and a full scale ideal value to obtain a gain error factor; means for dividing said gain error factor by the full scale ideal value to obtain said gain correction factor; and register means for storing said gain correction factor.

4. The gain corrected digital filter of claim 3 in which said means for determining includes means for loading the accumulator with the negated negative full scale value by introducing a negative 1 into one multiplicand register and the negative full scale value into the other for submission to the multiplier and subsequent addition to the reset accumulator, followed by a convolution that adds the positive full scale value to the negated negative full scale value in the accumulator.

5. The gain corrected digital filter of claim 4 in which said means for combining said difference and a full scale ideal value includes means for suppressing the most significant bit of said differences.

6. The gain corrected digital filter of claim 5 in which said means for dividing said gain error factor by said full scale ideal value includes means for shifting said full-scale ideal value.

7. The gain corrected digital filter of claim 6 in which said means for shifting includes means for suppressing a number of bits equal to the number of bits in said full-scale ideal value.

8. The gain corrected digital filter of claim 7 in which said means for suppressing a number of bits includes means for terminating the output of said bits in said full-scale ideal value.

9. The gain corrected digital filter of claim 5 in which said means for suppressing the most significant bit includes means for terminating the most significant bit output.

* * * * *